(12) United States Patent
Dussarrat

(10) Patent No.: US 7,972,975 B2
(45) Date of Patent: Jul. 5, 2011

(54) METHOD FOR FORMING A DIELECTRIC FILM AND NOVEL PRECURSORS FOR IMPLEMENTING SAID METHOD

(75) Inventor: Christian Dussarrat, Wilmington, DE (US)

(73) Assignee: L'Air Liquide, Societe Anonyme pour l'Etude et l'Exploitation des Procedes Georges Claude, Paris (FR)

( * ) Notice: Subject to any disclaimer, the term of this patent is extended or adjusted under 35 U.S.C. 154(b) by 178 days.

(21) Appl. No.: 11/917,931

(22) PCT Filed: Jun. 21, 2006

(86) PCT No.: PCT/FR2006/001495
§ 371 (c)(1),
(2), (4) Date: Feb. 1, 2010

(87) PCT Pub. No.: WO2006/136741
PCT Pub. Date: Dec. 28, 2006

(65) Prior Publication Data
US 2010/0130025 A1    May 27, 2010

(30) Foreign Application Priority Data
Jun. 21, 2005 (FR) .................................. 05 51675

(51) Int. Cl.
*H01L 21/31* (2006.01)

(52) U.S. Cl. ............... 438/780; 438/790; 257/E21.26; 427/249.15

(58) Field of Classification Search ................ 438/780, 438/790; 427/249.15
See application file for complete search history.

(56) References Cited

U.S. PATENT DOCUMENTS

| 4,923,716 A | 5/1990 | Brown et al. |
| 5,744,196 A | 4/1998 | Laxman et al. |
| 6,245,690 B1 | 6/2001 | Yau et al. |
| 2001/0026849 A1 | 10/2001 | Yau et al. |

FOREIGN PATENT DOCUMENTS

| EP | 0 533 129 | 3/1993 |
| JP | 2004 288979 | 10/2004 |

OTHER PUBLICATIONS

International Search Report for PCT/FR2006/001495.
Patent Abstracts of Japan, vol. 2003, No. 12, Dec. 5, 2003, & JP 2004 288979, Oct. 14, 2004.
Wrobel, A.M. et al. *Film-forming precursors in plasma chemical vapor depositing using tetramethyl-1,3-disilacyclobutane as a source compound.* J. of Chemical Vapor Deposition, Technomic Publ. Lancaster, PA, vol. 4, No. 2, Oct. 1995, pp. 87-110.

(Continued)

*Primary Examiner* — Alexander G Ghyka
(74) *Attorney, Agent, or Firm* — Patricia E. McQueeney

(57) ABSTRACT

The invention relates to dielectric layers with a low dielectric constant, said layers being used to separate metallic interconnections especially during the production of integrated circuit boards (in the BEOL part of the circuit). According to the invention, the dielectric layer comprises SiC and/or SiOC, and is obtained from at least one precursor comprising at least one —Si—C$_n$—Si chain where n=1.

4 Claims, 1 Drawing Sheet

OTHER PUBLICATIONS

Figure 1:
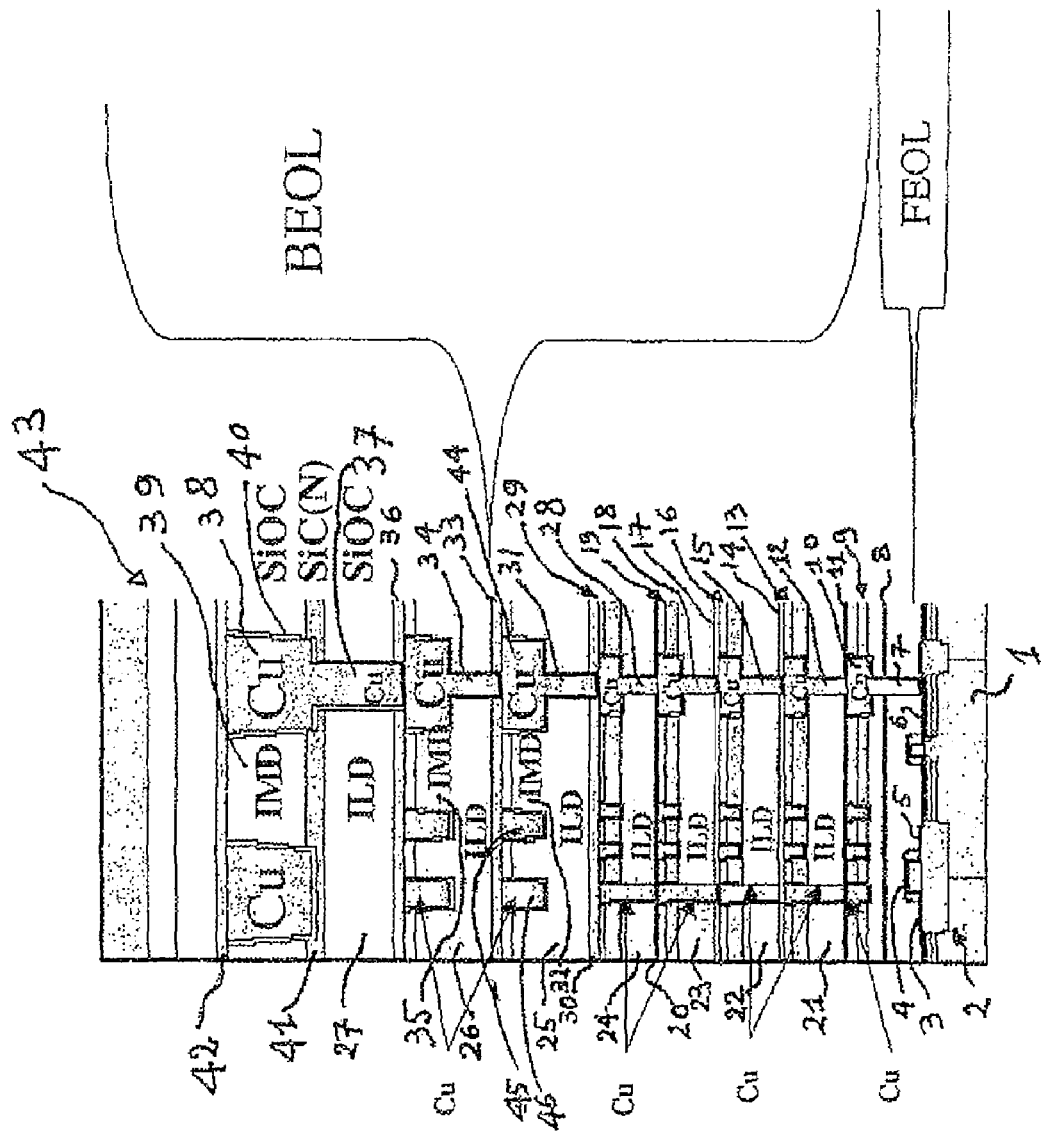

Maier, G. et al. *Hetero-π-systems. XIII. 1,4-disilabenzene. Dimethoxysilyls as ideal synthesis building blocks.* J. of Organometallic Chemistry, 366(1-2), 25-38, CODEN: JORCAI.

Laska, J.E. et al. *Synthesis, strain, conformational analysis, and molecular and crystal structures of 1,1,4,4-tetraphyenyl-1,4-disilacyclohexane and 1,1,4,4-tetraphenyl-1,4-disilacyclohexa-2,5-diene.* Organometallics, 17(10), 2018-2026, CODEN: ORGND7.

Maier, G. et al. *Hetero-π-systems. XVI. Alkoxysilylene (alkoxysilanediyl).* Tetrahedron Letters, Elsevier, Amsterdam, NL, vol. 26, No. 34, 1985, pp. 4079-4082.

PCT Written Opinion for related PCT/FR2006/001495, mailed Jan. 30, 2008.

Australian Written Opinion for related SG 200718851-9, mailed Mar. 6, 2009.

METHOD FOR FORMING A DIELECTRIC FILM AND NOVEL PRECURSORS FOR IMPLEMENTING SAID METHOD

This application is a 371 of International PCT Application PCT/FR2006/001495, filed Jun. 21, 2006.

BACKGROUND

The present invention relates to a process for forming a dielectric film that can be used in the fabrication of semiconductors and to novel precursors for implementing this process.

During the fabrication of integrated circuits, for example integrated circuits for commercial applications or for microprocessors, a very large number of successive steps of selectively depositing under vacuum various layers of products are carried out, these successive steps themselves being separated by cleaning steps, for cleaning the silicon wafer (nowadays having a diameter of 300 mm) on which these successive layers are stacked.

In general, two types of successively deposited layer may be distinguished:
- the first type of deposition or FEOL deposition essentially consists in depositing a multitude of successive layers in order to create active components of the field-effect transistor type (deposition of photosensitive layer, masking, exposure to UV radiation, cleaning, doping of the single-crystal layer depending on the type of transistor produced, then deposition of the electrodes, then deposition of the electrical contacts on the drain, source and gate zones of each transistor, etc.); and
- the second type of deposition or BEOL deposition consists in creating a network of electrical interconnections between the various electrical contacts, especially semiconductors produced during the various steps of the first type of deposition, but also in creating, in particular in the case of the fabrication of random-access memories, the capacitors needed for recording information in digital form. In both these types of application, the aim is essentially to deposit metallic and/or electrically conducting layers, to deposit dielectric layers having a very low dielectric constant separating these conducting layers, and to deposit barrier layers, in particular for preventing diffusion into the lower layers or laterally when one or more lower layers, whether dielectric or conducting, are etched using liquid chemicals or gaseous products while it being desirable for the etching to be selective.

The present invention essentially relates to the production of dielectric layers in the case of the second (BEOL) type of deposition envisioned above.

To increase the integration density of the circuits and correspondingly their data processing power in a smaller and smaller volume, it is necessary to reduce the dimensions (thickness and length) of the interconnect lines, thereby enabling them to be brought closer together and thus saving in volume, provided however that the dielectric layers that separate, on the one hand, the electrical connections of two successive layers in a vertical plane of the circuit, which layers are also called ILD (interlayer dielectric) layers, and, on the other hand, the metal interconnects lying within any one horizontal plane of the circuit, which layers are also called IMD (intermetal dielectric) layers, have improved dielectric properties (even lower dielectric constant) in order to provide sufficient electrical insulation between two connection lines that are closer together, but above all to reduce the time constant of the interconnect circuits (the capacitive component of the time constant has a lower value the lower the dielectric constant of the dielectric, but on the contrary a higher value the closer together its electrodes).

The ever increasing constraints imposed on the electrical interconnect wiring in the upper or BEOL part of the integrated circuit (see above) has recently led to important technological progress being made.

Copper has replaced aluminum as interconnect metal owing to its better electrical conductivity. This has led to the adoption of a new metal deposition process using what is called a "dual-damascene" technique during which a trench is created by the selective etching of a photosensitive resin or photoresist, which trench is then filled with copper using an electrodeposition process.

Moreover, films of SiOC (i.e. carbon-doped silicon oxide) are now widely used as a replacement for the silicon dioxide used previously as dielectric in the interlayer dielectric and intermetal dielectric layers of an integrated circuit.

Finally, with the aim of lowering the dielectric constant of these layers further, dielectrics having a porous structure have been introduced. $SiO_2$ dielectric films deposited by chemical vapor deposition (CVD), from a compound of silicon and oxygen, have a dielectric constant of about 4.0. The aim is to lower the dielectric constant of said layers so as to retain good insulating properties, while reducing their thickness. Films having a low dielectric constant, or low-k films, that is to say those made of materials having a dielectric constant of less than 4, may be produced in many ways, in particular by doping the silicon oxide with organic ligands so as to obtain films having a dielectric constant of between about 2.7 and 3.5. This approach, in which terminal organic ligands are used, that is to say those not connected to the network of the molecule of the final material, leads to the number of oxygen bonds (or "bridges") between two silicon atoms of the —Si—O—Si— type being reduced, which therefore reduces the cohesion of the chain structure and consequently leads to a reduction in the mechanical properties of this type of material compared with those of $SiO_2$. However, these mechanical properties are critical for preventing the successive layers of the integrated circuit from delaminating during the polishing process carried out in a subsequent step in the fabrication of the circuit (chemical mechanical polishing or CMP). Another important parameter to be considered in producing the dielectric layers is the possible existence of internal tensile stresses in the structure of the material constituting the film: most of the electronic structure is created at a temperature of around 300 to 450° C. When the assembly is cooled, the materials, including the silicon substrate, the copper network and the dielectric films, contract differently owing to their different expansion coefficients. This creates a major source of mechanical stresses that degrade the most brittle layer, namely the low-k SiOC layer.

To deposit these low-k SiOC layers, there are presently two processes:
- the chemical vapor deposition process, which uses precursors of the dimethyldimethoxysilane (DMDMOS), tetramethylsilane (4MS), tetramethylcyclo-tetrasiloxane (TMCTS) and octamethylcyclotetrasiloxane (OMCTS) type:

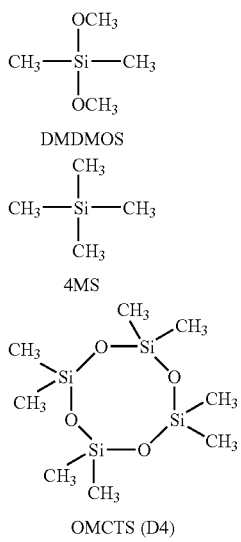

DMDMOS

4MS

OMCTS (D4)

the spin-on deposition process, which uses siloxanes to form films, such as methylsilsesquioxane (MSQ) or hydrogen silsesquioxane (HSQ) in a suitable solvent.

During deposition of the metal interconnect layers and of the SiOC layers that separate and isolate them, it is sometimes necessary to also deposit a thin layer of SiC (called an etch-stop layer) for stopping the passage of chemicals during a step of etching a layer deposited subsequently on top of said etch-stop layer. Silicon carbide is a refractory insulating material having a dielectric constant of about 5, which obviously increases the average dielectric constant of the dielectric layer thus separating two metal interconnect layers.

At the present time it is endeavored to reduce the dielectric constant of these etch-stop layers, especially SiC layers.

The object of the present invention is to improve particularly the mechanical properties of the dielectric layers, especially low-k layers, used in particular as interlayer dielectric layers or as intermetal dielectric layers for said BEOL electrical interconnection of the components of an integrated circuit. To solve the technical problem thus stated, the present invention consists in using precursors of layers of dielectric material containing at least one carbon atom and at least two silicon atoms, the carbon and silicon atoms forming a chain of the —Si—$C_n$—Si— type with at least one carbon atom linked to two silicon atoms, where n is greater than or equal to 1, preferably less than or equal to 5.

According to a first embodiment, it will be possible to use precursors of the alkoxysilylalkane $(R^iO)_3(Si(—CR^i_2)_n—Si(OR^i)_3$ type, in which formula each radical $R^i$ may be chosen from hydrogen or a carbon chain, for example of the alkyl, aryl, etc. type, with a number of carbon atoms between 1 and 5, preferably 1 or 2 carbon atoms, such as for example BTESE (bis(triethoxysilyl)ethane) of formula $(EtO)_3Si—CH_2—CH_2—Si(OEt)_3$, where $Et=C_2H_5$, the dielectric constant and the mechanical properties of which are substantially improved over the layers produced with the precursors of the prior art.

According to another embodiment, the invention consists in using cyclic molecules, which in particular make it possible to produce porous dielectric layers containing rings and chosen especially from one of the following families:

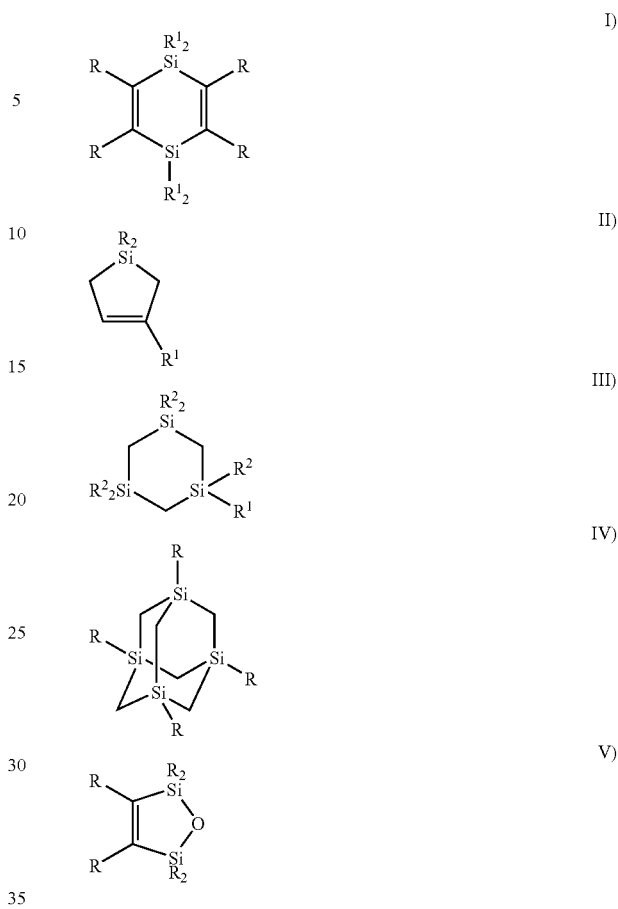

R, $R^1$, $R^2$ being chosen from hydrogen, linear and/or cyclic carbon chains, such as alkyl chains, aryl chains, etc., or alkoxides.

According to the invention it will be preferable to choose molecules such as "double-DMDMOS" (formula I in which R=H and $R^1$=—O—$CH_3$). More preferably still, R will be chosen from the following groups: H, —$CH_3$ or in general an alkyl group, $R^1$ being chosen from —O—$CH_3$ or, more generally, an alkoxide or an amine. Other ligands for $R^1$, such as Cl, Me or H, may also be chosen.

All these molecules contain at least one carbon atom between two silicon atoms. Preferably, these molecules form a ring or a cage (a three-dimensional structure, illustrated by the molecular structure IV) containing at least one Si—C—Si chain (with the possibility of several carbon atoms between two Si atoms). This type of three-dimensional molecule favors the formation of pores in the films obtained, thus ensuring both much greater structural cohesion than molecules with terminal alkyl groups and a very significant reduction in the dielectric constant.

These various precursors may for example be synthesized by reacting dichlorosilylene: —$SiCl_2$ with hydrocarbons having π bonds, such as acetylene or butadiene. The dichlorosilylene source may be hexachlorodisilane or trichlorosilane. It may be formed either at high temperature by decomposition of hexachlorodisilane (HOD) or at low temperature from a solution containing for example a tertiary amine as catalyst (such as trimethylamine). The synthesis of the molecules of formula I will for example be carried out in two steps:

the first step is common to all the molecules according to the reaction:

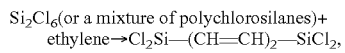
Si$_2$Cl$_6$(or a mixture of polychlorosilanes)+
ethylene→Cl$_2$Si—(CH=CH)$_2$—SiCl$_2$, acetylene, butadiene, benzene, etc. leading to this type of reaction according to the same principle: dichlorosilylene: —SiCl$_2$ reacts with the π bond. In general, all unsaturated species are potential candidates for synthesizing this type of molecule;

the second step is specific to the type of molecule in question:

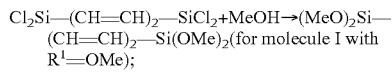
Cl$_2$Si—(CH=CH)$_2$—SiCl$_2$+MeOH→(MeO)$_2$Si—
(CH=CH)$_2$—Si(OMe)$_2$(for molecule I with
R$^1$=OMe);

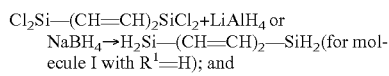
Cl$_2$Si—(CH=CH)$_2$SiCl$_2$+LiAlH$_4$ or
NaBH$_4$→H$_2$Si—(CH=CH)$_2$—SiH$_2$(for molecule I with R$^1$=H); and

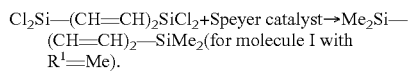
Cl$_2$Si—(CH=CH)$_2$SiCl$_2$+Speyer catalyst→Me$_2$Si—
(CH=CH)$_2$—SiMe$_2$(for molecule I with
R$^1$=Me).

It is also possible to obtain the fluorinated equivalent (for example F$_2$Si—(CH=CH)$_2$—SiF$_2$) with this method, it being possible for this fluorinated equivalent to be used to form low-k films.

In general, a person skilled in the art will find all the information needed to synthesize these various products in, for example, the publication by Atwell and Weyenberg, J. Am. Chem. Soc., 3438, 90, 1968.

According to the invention, the processes and the compositions meet the need, for a person skilled in the art, of forming a thin insulating layer having excellent electrical and mechanical properties and also high uniformity. The films deposited according to the invention are produced by vaporizing a source of low-k precursors consisting of one or more precursors for generating a vapor source of said precursors and by delivering the vapors of these precursors into a deposition chamber in which the precursors are thermally decomposed and/or decomposed by the use of a plasma, forming a film of the desired composition. The film is formed on one or more substrates in a single formation step without a subsequent heat treatment necessarily being required. The low-k film that results therefrom will have the desired composition, so as to have a low leakage current. In general, the precursors used in the process for depositing films to the desired stoichiometry according to the invention will be in liquid phase, for example a liquid precursor or a liquid solution of a precursor in a solvent, such as a hydrocarbon. The precursor in liquid phase is injected into a vaporization system, the rate of vaporization of which is measured and controlled beforehand. This vaporized precursor is taken into the deposition chamber where the deposition is carried out at a pressure of the order of 1 torr (generally less than 200 pascals) and at a temperature generally between 0° C. and 450° C., preferably between 200° C. and 400° C. Optionally, the chamber is provided with a plasma for significantly increasing the deposition rate. In general, but not necessarily, a coreactant is also introduced into the deposition chamber so as to react with the precursor, this coreactant preferably being an oxidizing agent (oxygen, ozone, water vapor, hydrogen peroxide, alcohols, etc.).

According to the invention, the film is deposited by a CVD (chemical vapor deposition) technique, such as the PECVD technique or the thermal CVD technique, these being well known to those skilled in the art, starting from at least one precursor, by itself or in combination with a reactant, preferably an oxygen source. In general, a person skilled in the art will optimize the precursor source by lowering the dielectric constant (k) as much as possible while still maintaining an acceptable level of mechanical properties.

Preferably, the precursor is a molecule containing one or more carbon atoms between two silicon atoms. Even more preferably, this molecule is cyclic.

According to another aspect of the invention, the molecule is a disilane, which decomposes by thermal or plasma excitation and reacts with an unsaturated carbon chain (containing π bonds) to form intermediate species containing —Si—C bonds, preferably to form intermediate species containing a carbon or a carbon chain (whether linear or cyclic) linked to two silicon atoms, during the fabrication of the low-k film. Preferably, the carbons forming a carbon chain connecting the silicon atoms will have at least one double bond because the C=C double bond is stronger than a C—C single bond. This allows low-k films to be obtained that have mechanical properties improved over the films obtained from a chain of carbon atoms containing only single bonds.

Furthermore, the molecules described above that do not contain oxygen atoms have a molecular structure which is very suitable for depositing a thin layer of SiC used as etch stop in the BEOL part of the integrated circuit.

Preferably, the low-k SiC precursor is a molecule containing one or more carbon atoms linked to two silicon atoms, but not containing oxygen. Even more preferably, the molecule is cyclic.

Preferably, the carbon atoms forming a carbon chain connecting the silicon atoms have a double bond (in so far as a C=C double bond is more difficult to break than a C—C single bond), thereby making it possible to achieve high mechanical properties in the resulting films more easily.

According to another aspect of the present invention, the low-k SiC precursor will be a disilane not containing oxygen, which decomposes by thermal or plasma excitation and reacts with an unsaturated carbon chain (containing π (pi) bonds) to form intermediate species containing Si—C bonds, preferably to form intermediate species containing a carbon atom or a carbon chain linked to two silicon atoms, during the fabrication of the SiC film.

According to one other aspect, the invention relates to the dielectric layers formed from the abovementioned precursors and to the use of these precursors for producing low-k dielectric layers.

The invention will be more clearly understood with the aid of the following exemplary embodiments given by way of non-limiting example together with the FIGURE, which shows a sectional view of an integrated circuit with its various layers in its FEOL and BEOL parts.

In the FIGURE, the single-crystal silicon wafer 1 on which the various MOS transistors with their interconnects and their protective layer are produced represents the FEOL part of the integrated circuit, all of the upper layers beyond the stop layer 8 representing the BEOL part in which the electrical interconnects between the various circuits of the FEOL part are produced as explained above.

Produced on the single-crystal substrate 1 is an integrated circuit, represented for example by 2, on which the drain contact (3), the gate contact (4), the source contact (5) and the interconnects in the horizontal level of this circuit, which interconnects are represented by (6), have been shown schematically. A vertical interconnect (7) made of tungsten or copper connects, in the sectional view shown in the FIGURE, a connection (6) through the stop layer (8) to the upper interconnect level (9) in which the copper connection (10), seen in cross section, extends in fact perpendicular to the plane of the FIGURE and is itself connected to the connection (12) at the upper level, then to the connection (15) and then to the connections (15, 18, 28, 31, 34, 37) before terminating at the central connection (38) in the upper interconnect part of the integrated circuit.

Between the various interconnect levels 9, 13, 16, 19, 29, etc. are the respective stop layers 11, 14, 17, 20, 30, 33, 36, 41, etc. which separate copper metal connections in various horizontal planes from one another, by means of ILD dielectric layers such as 21, 22, 23, 24, 25, 26, 27. In a set of layers of any one level, such as for example the set lying between the two stop layers 30 and 33, there is, in the lower part, an ILD dielectric layer for providing isolation between two successive horizontal copper interconnect layers and between the copper connection sidewalls such as 44, 45, 46 and to have an IMD dielectric layer so as to electrically isolate the copper electrical connections such as 44 and 45.

In the example shown in the FIGURE, the ILD and IMD layers are produced for example using the same SiOC dielectric.

The stop layers are in general SiC or SiN layers.

The invention relates to the formation of these interlayer dielectric layers or ILDs and to the formation of intermetal dielectric layers or IMDs.

It will be understood that many additional changes in the details, materials, steps and arrangement of parts, which have been herein described in order to explain the nature of the invention, may be made by those skilled in the art within the principle and scope of the invention as expressed in the appended claims. Thus, the present invention is not intended to be limited to the specific embodiments in the examples given above.

What is claimed is:

1. A process for forming a dielectric layer that can be used to separate metal interconnects, wherein said layer comprises SiC and/or SiOC, the process comprising:

a) vaporizing a precursor having a formula I:

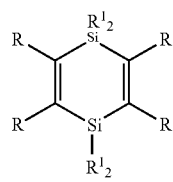

wherein the precursor has formula I selected from the group consisting of:

i) formula I in which R=H and $R^1$=—O—$CH_3$, ii) formula I in which R is —$CH_3$ and $R^1$=—O—$CH_3$, iii) formula I in which the precursor is

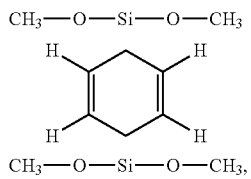

and combinations thereof, b) delivering the vaporized precursor into a vacuum deposition reactor in which a substrate, brought beforehand to a temperature T, is placed; and c) forming a dielectric film having a desired final composition.

2. The process of claim 1, wherein the precursor has formula I in which R is —$CH_3$ and $R^1$=—O—$CH_3$.

3. The process of claim 1, wherein the precursor is

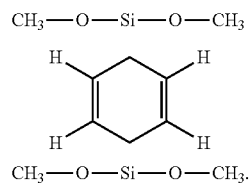

4. The process of claim 1, wherein the precursor has formula I in which R=H and $R^1$=—O—$CH_3$.

* * * * *